United States Patent [19]
Yew et al.

[11] Patent Number: 6,084,306
[45] Date of Patent: Jul. 4, 2000

[54] BRIDGING METHOD OF INTERCONNECTS FOR INTEGRATED CIRCUIT PACKAGES

[75] Inventors: Chee Kiang Yew; Kian Teng Eng; Ji Cheng Yang, all of Singapore, Singapore

[73] Assignee: Texas Instruments Incorporated, Dallas, Tex.

[21] Appl. No.: 09/087,440

[22] Filed: May 29, 1998

[51] Int. Cl.[7] .................................................. H01L 23/535
[52] U.S. Cl. ........................... 257/776; 257/778; 257/758
[58] Field of Search ..................................... 257/758, 759, 257/778, 777, 776

[56] References Cited

U.S. PATENT DOCUMENTS

| | | | |
|---|---|---|---|
| 3,179,913 | 4/1965 | Mittler et al. | 339/18 |
| 3,370,203 | 2/1968 | Kravitz et al. | 317/101 |
| 3,459,998 | 8/1969 | Focarile | 317/100 |
| 3,904,934 | 9/1975 | Martin | 317/101 |
| 4,288,841 | 9/1981 | Gogal | 361/414 |
| 4,502,098 | 2/1985 | Brown et al. | 361/383 |
| 4,574,331 | 3/1986 | Smolley | 361/393 |
| 4,646,128 | 2/1987 | Carson et al. | 357/74 |
| 4,721,995 | 1/1988 | Tanizawa | 257/777 |
| 4,727,410 | 2/1988 | Higgins, III | 357/74 |
| 4,823,233 | 4/1989 | Brown et al. | 361/383 |
| 4,833,568 | 5/1989 | Berhold | 361/383 |
| 4,862,249 | 8/1989 | Carlson | 357/80 |
| 4,868,712 | 9/1989 | Woodman | 361/388 |
| 4,953,005 | 8/1990 | Carlson et al. | 357/80 |
| 5,016,138 | 5/1991 | Woodman | 361/381 |
| 5,019,945 | 5/1991 | Smolley | 361/412 |
| 5,336,928 | 8/1994 | Neugebauer et al. | 257/758 |
| 5,523,622 | 6/1996 | Harada et al. | 257/778 |
| 5,798,567 | 8/1998 | Kelly et al. | 257/778 |

*Primary Examiner*—David Hardy
*Attorney, Agent, or Firm*—Mark A. Valetti; Wade James Brady, III; Frederick J. Telecky, Jr.

[57] ABSTRACT

An integrated circuit package (30) having first and second layers (76, 78), a plurality of routing pads (82) being integral with the first layer (76), a plurality of upper and lower conduits (18, 118), respectively, disposed on the upper and lower surfaces (92, 94) of the first layer (76), at least one of the upper conduits (18) electrically connected to at least one of the lower conduits (118), a plurality of pads (100) disposed on the second layer (78), vias (84) that electrically connect the pads (100) to the lower conduits (118) and a chip (50) adhered to the second layer (78) having bonding pads (120) at least one of which is electrically connected to at least one of the routing pads (82), is disclosed.

17 Claims, 1 Drawing Sheet

BRIDGING METHOD OF INTERCONNECTS FOR INTEGRATED CIRCUIT PACKAGES

TECHNICAL FIELD OF THE INVENTION

The present invention relates in general to the field of integrated circuit packages, and more specifically, to bridging interconnects for electrically connecting integrated circuit packages and a method for producing the same.

BACKGROUND OF THE INVENTION

Without limiting the scope of the invention, its background is described in connection with integrated circuit packages, as an example.

Heretofore, in this field, integrated circuits have been formed on semiconductor wafers. The wafers are separated into individual chips and the individual chips are then handled and packaged. The packaging process is one of the most critical steps in the integrated circuit fabrication process, both from the point of view of cost and of reliability. Specifically, the packaging cost can easily exceed the cost of the integrated circuit chip, as the majority of device failures are packaging related.

The integrated circuit must be packaged in a suitable medium that will protect it in subsequent manufacturing steps and from the environment of its intended application. Wire bonding and encapsulation are the two main steps in the packaging process. Wire bonding connects the leads from the chip to the terminals of the package. The terminals allow the integrated circuit package to be connected to other components. Following wire bonding, encapsulation is employed to seal the surfaces from moisture and contamination and to protect the wire bonding and other components from corrosion and mechanical shock.

Conventionally, the packaging of integrated circuits has involved attaching an individual chip to a lead frame, where, following wire bonding and encapsulation, designated parts of the lead frame become the terminals of the package. The packaging of integrated circuits has also involved the placement of chips on a flexible board where, following adhesion of the chip to the surface of the flexible board and wire bonding, an encapsulant is placed over the chip and the adjacent flexible board to seal and protect the chip and other components.

Unfortunately, current methods for wire bonding and encapsulating silicon chips have led to various problems, including cracking between the encapsulation material, the wire bonding and the integrated circuit components, as well as high failure rates due to the multi-step nature of the process. Cracking has plagued the industry because of differences in the coefficient of thermal expansion of the different components, for example, between the interfaces of metallic and non-metallic components. Cracking is also frequent between the silicon wafer and the encapsulation materials, usually epoxies, due to the extreme variations in temperature in various environments and between periods of operation and non-operation.

Therefore, a need has arisen for electrical interconnections that overcome the problems associated with multiple wiring and bonding steps within integrated circuit packages as well as a process for electrically interconnecting integrated circuit packages. A need has also arisen for materials and methods that lead to increased yield by more closely matching the coefficient of thermal expansion of the materials used in the package. Furthermore, a need has arisen for an integrated circuit package that provides protection during subsequent manufacturing and testing steps and from the environment of its intended purpose.

SUMMARY OF THE INVENTION

The present invention disclosed herein comprises electrical bridging for interconnections within integrated circuit packages and a process for producing electrical bridging for interconnections within integrated circuit packages that protects the components of the integrated circuit package during manufacturing and testing steps, and from the environment of its intended purpose.

The electrical bridging for interconnecting integrated circuit packages of the present invention comprises a first layer having first and second surfaces and a plurality of routing pads disposed on the second surface of the first layer. A plurality of conduits are disposed on the first and second surfaces of the first layer. The conduits on the second surface are electrically connected to the routing pads. Vias that are integral with the first layer electrically connect the conduits on the first surface with the conduits on the second surfaces of the first layer. The present invention also includes a second layer having first and second surfaces and a cavity. A plurality of pads are disposed on the second surface of the second layer. These pads are electrically connected with at least one of the conduits on the second surface of the first layer by, for example, a via. A chip having bonding pads on the surface facing the first layer, is adhered in the cavity. The bonding pads on the chip are electrically connected to the routing pads on the second surface of the first layer, thereby interconnecting the chip with the first and second layers. The layers may be, for example, FR-4 or FR-5 printed circuit board layers.

The integrated circuit package may further include at least one bus bar being integral with the first layer on its second surface. The bus bar is electrically connected to the bonding pads on the chip. The integrated circuit package may further include a third layer disposed on the first surface of the first layer to isolate the conduits on the first surface of the first layer from the environment.

Solder balls or solder columns may be located on the pads. The pads may be disposed on the first surface of the first layer, on the second surface of the second layer or on both. The pads on the two surfaces may be electrically connected using vias.

The present invention also comprises an integrated circuit package produced by a process comprising the steps of obtaining a first layer having first and second surfaces and extending a plurality of routing pads on the first layer. A plurality of conduits are also disposed on the first and second surfaces of the first layer and are electrically connected to the conduits on the first and second surfaces. Next, a second layer is obtained having first and second surfaces and a cavity. At least one pad is placed on the second surface of the second layer and is electrically connected to at least one conduit on the second surface of the first layer. Finally, a chip is adhered in the cavity, the chip having at least one bonding pad. The bonding pad on the chip is electrically connected to the routing pads.

The process of producing an integrated circuit package may also include the steps of disposing a bus bar on the second surface of the first layer and electrically connecting it to at least one bonding pad on the chip. Solder balls may also be attached to at least one of the pads on the second surface of the second layer, on the first surface of the first layer or on both.

BRIEF DESCRIPTION OF THE DRAWINGS

For a more complete understanding of the features and advantages of the present invention, reference is now made to the detailed description of the invention along with the accompanying figures, in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts, which can be embodied in a wide variety of specific contexts. The specific embodiments discussed herein are merely illustrative of specific ways to make and use the invention and do not delimit the scope of the invention.

The present invention is related to high frequency electrical bridging for interconnections within integrated circuit packages which is capable of achieving high speed performance and meeting the space constraint requirements of modern semiconductors. The principles of the present invention may be incorporated into, for example, a synchronous DRAM (SDRAM) silicon chip. The present invention, however, is also applicable to LOGIC, SRAM, EPROM and any other integrated circuit components.

Figure 1:
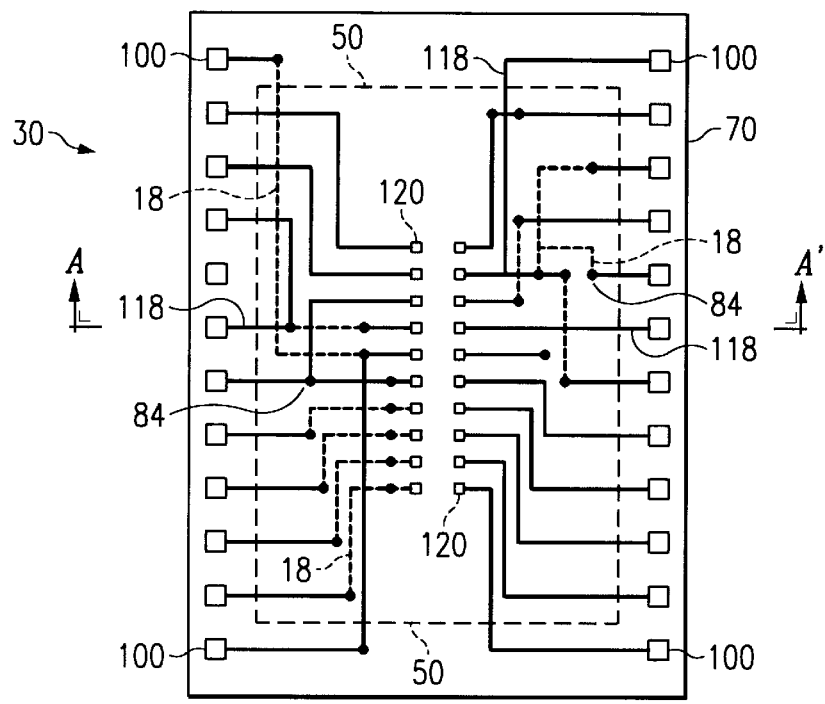
FIG. 1 is a simplified top view of an electrical bridging for interconnections within an integrated circuit package of the present invention.

Referring to FIG. 1, electrical bridging for interconnections within an integrated circuit package is shown and is generally designated 30. Pads 100 are located on a printed circuit board 70 and are electrically connected to a silicon chip 50 by lower conduits 118. In order to avoid the planar intersection of electrically conductive lower conduits 118, leading to short circuits, electrical bridging is constructed using vias 84 and upper conduits 18. A second via 84 is used to connect the upper conduit 18 to a lower conduit 118 for contact with a bonding pad 120 on silicon chip 50. It should be understood by one skilled in the art that the terms "top" and "bottom" as well as the terms "side", "end", "upper" and "lower" are used for illustration purposes only, as the integrated circuit package 30 of the present invention can be assembled and used in a variety of positions and ways.

The silicon chip 50 depicted in FIG. 1 has bonding pads 120 located generally in the central area of silicon chip 50. Alternatively, the silicon chip 50 may have bonding pads that are located along the perimeter of the silicon chip 50, wherein the bridging interconnects of the present invention would be adjusted to conform with the positioning of the bonding pads 120, as will be known to those of skill in the art in light of the present disclosure.

Figure 2:
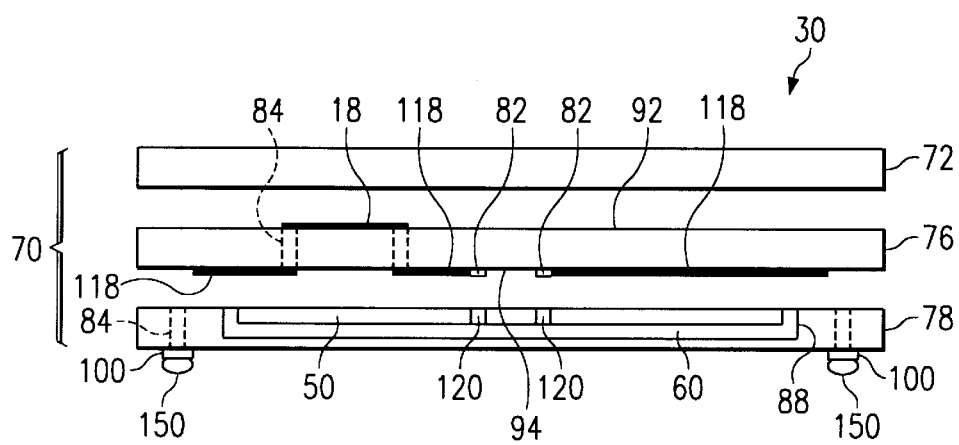
FIG. 2 is a simplified end cross-sectional view taken along line A–A' of FIG. 1.

FIG. 2 is a simplified cross-sectional view of electrical bridging for interconnecting integrated circuit packages along the A–A' line of FIG. 1. The integrated circuit package 30 includes a silicon chip 50, which can be, for example, any integrated circuit component such as a DRAM, an EPROM, a SRAM or a LOGIC chip. Silicon chip 50 is attached to printed circuit board 70 in cavity 88 by an adhesive layer 60. The adhesive layer 60 may be made of, for example, a double-sided adhesive polyamide tape, adhesive glue or epoxy. The integrated circuit package 30 consists of three layers, a top layer 72, an intermediate layer 76, and a bottom layer 78, which may be printed circuit board 70. Bottom layer 78 has a cavity 88 for placing the adhesive layer 60 and the silicon chip 50.

Intermediate layer 76 has upper conduits 18 disposed on, or integral with, first surface 92. Intermediate layer 76 has lower conduits 118 disposed on, or integral with, second surface 94. Upper conduits 18 and lower conduits 118 are electrically connected by vias 84. The lower conduits 118 terminate in routing pads 82 that are positioned to come in electrical contact with bonding pads 120 on silicon chip 50. Upper conduits 18 and lower conduits 118 are electrically connected to pads 100 located on top layer 72 or bottom layer 78 by vias 84.

The printed circuit board 70 may be constructed from a material such as FR-4 which is available from, for example, Motorola Inc., U.S.A. Alternatively, the printed circuit boards 70 can be made of an FR-5 substrate, available from Hitachi, Japan. FR-4 is an epoxy resin reinforced with a woven glass cloth. In selecting the material for printed circuit board 70, one skilled in the art will recognize that four parameters should be considered, namely, thickness, dielectric constant, glass transition temperature and the coefficient of thermal expansion.

Thickness is dependant on the number of layers required and the amount of reinforcement used in a given layer. The reinforcing glass cloth can range in thickness from 2 mil per sheet (type 106) to about 8 mil per sheet (type 7628). Dielectric constant is determined by a combination of the resin used and the thickness and type of reinforcement used. Standard FR-4, for example, has a dielectric constant of about 4.5. This constant can be reduced to about 3 by replacing the epoxy resin with a cyanate ester resin. The greater the thickness, however, the greater the problems associated with thickness control, rough surfaces, excessive drill reflection and poor resin refill.

The temperature at which a resin changes from a glass-like state into a "rubbery" state is generally designated as $T_g$. Standard FR-4 is made with a bifunctionally polymerizing epoxy that has a $T_g$ of about 110° C. Higher $T_g$ temperatures, such as 125–150° C. may be withstood by using a tetrafunctional epoxy. For higher $T_g$ values, in the range of 150 to 200° C. a cyanate ester:epoxy blend can be used. Additionally, polyimides provide for printed circuit boards having a $T_g$ above 250° C.

The coefficient of thermal expansion for FR-4 is about 16 ppm/°C. A difference in the coefficient of thermal expansion between the printed circuit board 70 made from FR-4 and the silicon chip 50 can lead to failure of the integrated circuit package 30 during, not only the assembly of the integrated circuit package 30, but also during the use of integrated circuit package 30.

The adhesive layer 60 may be Hitachi HM122u. Alternatively, the silicon chip 50 can be adhered to a printed circuit board 70 with a die bonding film such as HIATTACH-335 (DF-335) manufactured by Hitachi Chemical Company of Tokyo, Japan. HIATTACH-335 (DF-335) is silver filled thermosetting type resin film for die-attaching. The bonding process generally involves attaching the film on the printed circuit board 70 at 160° C. for 5 seconds with an applied force of 1000–3000 grams, followed by the attachment of silicon chip 50 on the film at 220° C. for 5 seconds under a force of 150–200 grams.

| DF-335 has the following properties | | | |
|---|---|---|---|
| Test | Remarks | Units | DF-335 |
| Appearance | Visual | — | silver film |
| Solid Content | 200° C.-2 h | wt % | ≧96 |
| Ash Content | 600° C.-1.5 h | wt % | 40 |
| Ash Content/ Solid | 600° C.-1.5 h | wt %/solid | 42 |
| Thickness | Dial gauge | μm | 25 |
| Tensile Strength | R.T. | kgf/mm² | 7.1 |
| Tensile Modulus | R.T. | kgf/mm² | 271 |
| Die shear strength | 4 × 4 mm chip/Ag plated alloy 42 | kgf/chip | |
| R.T. | | | ≧10 |
| 250° C. | | | 0.9 |
| Peel strength 240° C. (after/ 85° C. 85%, 48 h) | 8 × 8 mm chip/bare alloy 42 | kgf/chip | ≧3.0 |
| Tg | TMA, 180° C.-1 h cured | ° C. | 123 |
| Modulus | Viscoelastic spectrometer | Mpa | 1300 |
| Moisture | 85° C./85% RH, 48 h | wt % | 0.1 |

Other examples of adhesives include thermosetting adhesives, such as epoxies, polyimides and silicone. Thermoplastic adhesives that are hot-melted, in the form of sheets or as a pressure sensitive adhesive tape may also be used to adhere silicon chip 50 to the printed circuit board 70. Commonly used are adhesive tapes based on elastomers, silicones or acrylics because of their ease of use and easy incorporation into production.

Intermediate layer 76 may include a pair of bus bars (not depicted). The bus bars may serve, for example, as power supplies or grounds, and it is preferred that one bus bar serve one function, such as a power supply, and the second bus bar serve another function, such as a ground.

Solder balls 150 are located on pads 100 to allow integrated circuit package 30 to be attached to other components, such as a motherboard or a single in-line memory module.

Even though FIG. 2 depicts integrated circuit package 30 as having three layers 72, 76 and 78, it should be understood by one skilled in the art that integrated circuit package 30 may consist of a multi-layered board having an alternate number of layers.

The solder balls 150 used with the present invention may be attached to the pads 100 using conventional solder reflow systems. For example, a vapor phase solder reflow system may be used, which condenses vapor to surround the integrated circuit package 30 and the printed circuit board 70 with a cloud of steam. A liquid, such as a nonchlorinated (non CFC) fluorocarbon is first heated with enough energy to form a vapor and to sustain a vapor cloud. When the integrated circuit package 30 is then passed through the vapor, the vaporized liquid condenses thereon and gives off the latent heat of vaporization. This energy is then transferred to the integrated circuit package 30. As long as the integrated circuit package 30 remains in the vapor, the vapor continues to give off energy at a repeatable fixed rate and temperature, until the integrated circuit package 30 reaches the temperature of the vapor.

The advantage of using a nonchlorinated fluorocarbon is that it is extremely thermally stable, colorless, odorless and nonflammable. In addition, it has a low toxicity, low surface temperature, low boiling point, and low heat of vaporization. Because the fluid form of the non-chlorinated fluorocarbon is inert, it does not react with fluxes or component materials, nor does it absorb oxygen or other gases that cause reactions during the solder reflow. Most commercially available fluorocarbons used for vapor phase reflow are formulated to vaporize at precisely stable reflow temperatures for different solder materials, as will be known to those skilled in the art.

The vaporization temperature will depend on the solder type being used. A brief list of the temperatures at which non-chlorinated fluorocarbons are used to generate vapor fluids, and the corresponding solder composition is shown below.

| Vaporization Temperatures and Solder Types | |
|---|---|
| Fluid Temperature | Solder Type |
| 56, 80, 97, 101, 102° C. and 155° C. | 100 In |
| | 37 Sn/38 Pb/25 In |
| 165° C. | 70 Sn/18 Pn/12 In |
| | 70 In/30 Pb |
| 174° C. | 60 In/40 Pb |
| 190° C. | 90 In/10 Ag |
| | 50 In/50 Pb |
| | 63 Sn/37 Pb |
| | 70 Sn/30 Pb |
| | 60 Sn/40 Pb |
| 215° C. and 230° C. | 60 Sn/40 In |
| | 60 Sn/40 Pb |
| | 63 Sn/37 Pb |
| | 70 Sn/30 Pb |
| | 62 Sn/36 Pb/2 Ag |
| 240° C. and 253° C. | 75 Pb/25 In |
| | 81 Pb/19 In |
| 260° C. and 265° C. | 96.5 Sn/3.5 Ag |

Alternatively, infrared or radiant heated solder reflow may be used. In such a system each component of the soldering system is directly exposed to radiation from a heating element. Heat from the radiant energy element is absorbed by the different components according to its molecular structure.

Conventional radiant heat systems expose only the outer surfaces of the components to the radiant heat, which may not reach interior areas as efficiently as with vapor saturated heating methods as described above. The present invention, however, is not affected by this typical problem because of the use of solder balls 150 instead of leads. In fact, due to the reduced overall size either method, vapor phase solder reflow or radiant heated solder reflow, may be effectively used with the present invention.

The present invention also solves other problems associated with solder reflow systems. These problems include the creation or failure due to voids, coplanarity, tombstoning, open joints, component cracking, thermal shock and thermal stressing.

Figure 3:
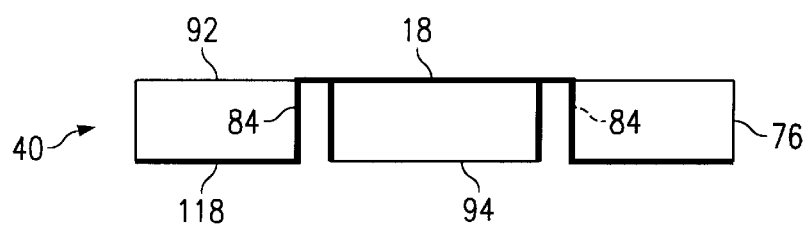
FIG. 3 is a simplified end cross-sectional close-up view of an electrical bridging for interconnections within an integrated circuit package of the present invention.

FIG. 3 is a simplified cross-sectional close-up of bridging interconnections within an integrated circuit package of the present invention that is generally designated 40. Intermediate layer 76 is depicted having an upper surface 92 and a lower surface 94. Disposed along lower surface 94 is a lower conduit 118 that is electrically connected to a via 84, which is electrically connected to an upper conduit 18. Upper conduit 18 travels along upper surface 92 until it reaches another via 84 that electrically connects upper conduit 18 to a lower conduit 118 on lower surface 94. The types of vias 84 that may be used with the present invention include small holes drilled through the printed circuit board material that are lined or filled with electrically conductive material. Alternatively, blind or buried vias 84 may be used with the bridging interconnections of the present invention, depending on the number of layers and type of sequential lamination used to produce the printed circuit board 70.

The present invention achieves an overall reduction in integrated circuit package 30 height by placing the silicon chip 50 between printed circuit board layers. The silicon chip 50 is attached to a cavity 88, which allows for decreased failure due to the elimination of wire bonding. The present invention further reduces the overall number of steps in the assembly of, for example, memory units by streamlining the assembly process not only in reduced number of steps, but also by elimination the curing steps associated with encapsulating integrated circuit. The present invention further reduces the amount of material used in producing integrated circuit packages 30, thereby saving time, money and the environment.

Furthermore, the method of the present invention takes advantage of the cavity 88 at the center of the printed circuit board 70 for connecting the silicon chip 50 and the layers of a bottom layer 78 in a single step. By placing an adhesive layer 60 in the cavity 88 of bottom layer 78 the silicon chip 50 is generally protected from the environment and, more particularly, is protected from moisture due to the hermetic nature of the encapsulation.

The present invention also eliminates the need for potting material, greatly reducing the overall profile of the integrated circuit package 30. By eliminating the need for potting material, the present invention also eliminates the coefficient of expansion of potting material as one of the variables that affects integrated circuit reliability.

The present invention also reduces the problems of coplanarity by using solder balls 150 to attach the integrated circuit package 30 to another printed circuit board, such as a mother board or sister board, because there are no leads that may bend and there are no deviations from the plane of the board to which the integrated circuit package 30 is being connected.

Additionally, reduced environmental impact is obtained using the method and apparatus of the present invention due to the overall decrease in the size of the integrated circuit package 30, and the reduced number of components.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit package comprising:
   first and second layers, said first and second layers each having first and second surfaces;
   a chip disposed between said second surface of said first layer and said first surface of said second layer, said chip having a bonding pad;
   a conduit having first and second ends, said first end electrically connected to said bonding pad, said conduit partially disposed on said second surface of said first layer and partially disposed on said first surface of said first layer; and
   a pad electrically connected to said second end of said conduit;
   further including a solder ball located on said pad.

2. The integrated circuit package as recited in claim 1 wherein said conduit further includes a via extending between said first and second surfaces of said first layer.

3. The integrated circuit package as recited in claim 1 further including a third layer disposed on said first surface of said first layer.

4. The integrated circuit package as recited in claim 1 further including a pad disposed on said first surface of said first layer.

5. The integrated circuit package as recited in claim 1 wherein said conduit has first, second and third sections, said first section disposed on said second surface of said first layer, said second section disposed on said first surface of said second layer, and said third section disposed on said second surface of said first layer.

6. The integrated circuit package as recited in claim 1 further including a routing pad disposed on said second surface of said first layer, said routing pad electrically connecting said conduit with said bonding pad.

7. An integrated circuit package comprising:
   first and second layers, said first and second layers each having first and second surfaces;
   a chip disposed between said second surface of said first layer and said first surface of said second layer, said chip having a bonding pad;
   a conduit having first and second ends, said first end electrically connected to said bonding pad, said conduit partially disposed on said second surface of said first layer and partially disposed on said first surface of said first layer; and
   a pad electrically connected to said second end of said conduit;
   wherein said pad is disposed on said second surface of said second layer.

8. The integrated circuit package as recited in claim 7 further comprising a via extending through said second layer electrically connecting said conduit with said pad.

9. An integrated circuit package comprising:
   first and second layers, said first and second layers each having first and second surfaces, and said second layer having a cavity;
   a plurality of routing pads being integral with said second surface of said first layer;
   a chip adhered in said cavity, said chip having a plurality of bonding pads electrically connected to said routing strips;
   a plurality of conduits, said conduits having first and second ends, said conduit partially disposed on said second surface of said first layer and said first surface of said second layer, said first end electrically connected to said routing pads;
   vias electrically connecting said conduits partially disposed on said second surface of said first layer and said conduits partially disposed on said first surface of said second layer; and
   a plurality of pads disposed on said second surface of said second layer, said pads electrically connected with said second ends of said conduits;
   further including a plurality of solder balls located on said pads.

10. An integrated circuit package comprising:
    first and second layers, said first and second layers each having first and second surfaces and said second layer having a cavity;

a plurality of routing pads being integral with said second surface of said first layer; a chip adhered in said cavity, said chip having a plurality of bonding pads electrically connected to said routing strips;

a plurality of conduits said conduits having first and second ends, said conduit partially disposed on said second surface of said first layer and said first surface of said second layer, said first end electrically connected to said routing pads;

vias electrically connecting said conduits partially disposed on said second surface of said first layer and said conduits partially disposed on said first surface of said second layer; and a plurality of pads disposed on said second surface of said second layer, said pads electrically connected with said second ends of said conduits;

further including a plurality of pads disposed on said first surface of said first layer.

11. The integrated circuit package as recited in claim 10 further including a plurality of solder balls located on said pads disposed on said first surface of said first layer and a plurality of solder balls located on said pads disposed on said second surface of said second layer.

12. An integrated circuit package produced by a process comprising the steps of:

obtaining first and second layers, said first and second layers each having first and second surfaces;

adhering a chip to said first surface of said second layer said chip having a bonding pad;

disposing a conduit having first and second ends on said first layer, said conduit being partially disposed on said first surface of said first layer and partially disposed on said second surface of said first layer;

electrically connecting said first end of said conduit to said bonding pad; and electrically connecting said second end of said conduit to a pad on said second surface of said second layer;

further including the step of disposing a third layer on said first surface of said first layer.

13. The process as recited in claim 12 wherein said conduit further includes a via extending between said first and second surfaces of said first layer.

14. The process as recited in claim 12 further including the step of disposing a third layer on said first surface of said first layer.

15. The process as recited in claim 12 further including a pad disposed on said first surface of said first layer.

16. The process as recited in claim 12 wherein said conduit has first, second and third sections, said first section disposed on said second surface of said first layer, said second section disposed on said first surface of said second layer, and said third section disposed on said second surface of said first layer.

17. An integrated circuit package produced by a process comprising the steps of:

obtaining first and second layers, said first and second layers each having first and second surfaces;

adhering a chip to said first surface of said second layer, said chip having a bonding pad;

disposing a conduit having first and second ends on said first layer, said conduit being partially disposed on said first surface of said first layer and partially disposed on said second surface of said first layer;

electrically connecting said first end of said conduit to said bonding pad; and electrically connecting said second end of said conduit to a pad on said second surface of said second layer;

further comprising a via extending through said first and second layers and electrically connecting said conduit with said vias.

* * * * *